(12) United States Patent
Takabe

(10) Patent No.: US 6,862,716 B2
(45) Date of Patent: Mar. 1, 2005

(54) METHOD FOR DESIGNING INTERCONNECTS IN AN LSI

(75) Inventor: Takashi Takabe, Kanagawa (JP)

(73) Assignee: NEC Electronics Corporation, Kanagawa (JP)

(*) Notice: Subject to any disclaimer, the term of this patent is extended or adjusted under 35 U.S.C. 154(b) by 17 days.

(21) Appl. No.: 10/634,098

(22) Filed: Aug. 4, 2003

(65) Prior Publication Data

US 2004/0031011 A1 Feb. 12, 2004

(30) Foreign Application Priority Data

Aug. 5, 2002 (JP) ........................................ 2002-226987

(51) Int. Cl.[7] .............................................. G06F 7/50
(52) U.S. Cl. ........................................................ 716/2
(58) Field of Search ............................................ 716/2

(56) References Cited

U.S. PATENT DOCUMENTS 6,038,383 A * 3/2000 Young et al. ................... 716/5
6,587,991 B1 * 7/2003 Mbouombouo et al. ....... 716/2

FOREIGN PATENT DOCUMENTS

| JP | 62-120043 | 1/1987 |
|---|---|---|
| JP | 03-204958 | 6/1991 |
| JP | 04-107953 | 9/1992 |

* cited by examiner

Primary Examiner—Stacy A. Whitmore
(74) Attorney, Agent, or Firm—Scully, Scott, Murphy & Presser

(57) ABSTRACT

A method includes the steps of estimating a positive-component average current avg_p and a negative-component average current avg_n of each of terminals of circuit elements; separating the terminals into a positive-node terminal set and a negative-node terminal set by a target branch; calculating Iavg_p and Iavg_n of the target branch as follows:

$$\text{Iavg\_p} = \min\left(\sum_{m=1}^{M} a_m \cdot \text{avg\_n}_m, \sum_{m=1}^{M} (1 - a_m) \cdot \text{avg\_p}_m\right), \text{ and}$$

$$\text{Iavg\_n} = \min\left(\sum_{m=1}^{M} a_m \cdot \text{avg\_p}_m, \sum_{m=1}^{M} (1 - a_m) \cdot \text{avg\_n}_m\right),$$

wherein m is the sequential number of the terminals, M is the highest sequential number, am=1 or am=0 depending on the m-th terminal belonging to the positive-node terminal set or negative-node terminal set; selecting a larger value of Iavg_p and Iavg_n as the target branch; and determining the size of the interconnect for the target branch.

10 Claims, 3 Drawing Sheets

METHOD FOR DESIGNING INTERCONNECTS IN AN LSI

BACKGROUND OF THE INVENTION (a) Field of the Invention

The present invention relates to a method for designing interconnects between circuit elements and/or circuit devices in an LSI.

(b) Description of the Related Art

Conventional techniques for designing interconnects in an LSI include one wherein all the interconnects in the LSI are expressed by nets in a text file or netlist, each of the nets specifying connection between terminals of circuit elements and being calculated for the current flowing therethrough before determining the size of each interconnect.

The technique as described above uses a computer system on which a design program is installed for operating the computer system based on the commands included in the design program. The computer system is used for arrangement of circuit elements and for connection between the terminals of the circuit elements based on the netlist description of the LSI during developing a new LSI. The netlist tabulates all the nets, or interconnects, in the LSI to be designed for the details including size, location etc. thereof. The computer system used for this purpose generally includes a processor, input/output (I/O) devices, storage devices and is called a CAD system.

It is indispensable in the design of the LSI to estimating the currents and determining the sizes (widths) of internal source lines connected to the external source line and ground line for the LSI. JP-A-62-120043 and -3-204958, for example, describe methods for designing internal source lines by estimating the current for each of the circuit blocks and/or grids of the LSI. In these publications, it is also recited that the signal lines are estimated for the currents and widths of respective nets with reference to the netlist described as a text file in the case of a high-frequency LSI, wherein the effective current increases together with the frequency, thereby reducing voltage drops and signal delays and/or suppressing generation of electro-migrations in the interconnects of the high-frequency LSI.

FIG. 4 exemplarily shows a flowchart of the conventional method for designing interconnects described in Patent Publication JP-A-4-107953. In this technique, a logic simulation is first performed in step S41 while using netlist descriptions and operational test patterns of the logic circuits to estimate the number of operations for each net as well as the test period and number of test patterns. For the step S41, a unit no-load current flowing into each cell or circuit element during no-load thereof for a unit frequency, and a load-dependent coefficient specifying a current flowing for the unit frequency and for a unit capacitance depending on the load of the each cell or circuit element are prepared beforehand based on the netlist descriptions.

In steps S42 and S43, each cell or circuit element is arranged by using an automated layout technique, and then subjected to an automated interconnection design process, followed by obtaining the detailed information of the designed interconnect including the width, length and load capacitance thereof in step S44.

In step S45, the operating current of each net is estimated based on the number of operations, test cycle, number of test patterns, unit no-load current, load-dependent coefficient, and detailed information of the designed interconnect, followed by comparing the estimated operating current against the permissible current of the designed interconnect in step S46. If the estimated operating current exceeds the permissible current of the designed interconnect, the process returns to step S42 or S43 to change the arrangement of the cell or circuit element or the details of the interconnect.

By the above procedures, a suitable design for the interconnects can be obtained wherein excessive voltage drop and excessive signal delay as well as electro-migration can be prevented by obtaining a suitable line resistance and a suitable current density while changing the layout of the cell or the details of the interconnect to thereby lower the line resistance and load capacitance or to increase the line width.

In general, even in the case that the LSI is implemented as a CMOS device, a single bus line provided in a data bus may be connected to a plurality of input/output devices, or a plurality of branches may be provided for the bus line in the practical circuit. In such a case, the current flowing through the bus line may be different in the amount or direction for different portions of the bus line or at different timings for each portion depending on the operating patterns. However, in the technique as described above, all the interconnects including a bus line are designed by using a blanket procedure, wherein the current of each net is calculated by assuming a lumped parameter system. This is likely to result in an overestimation such as an excessive load capacitance and/or an increased permissible current for the bus line of the LSI.

It may be considered to estimate the line resistance and line capacitance based on the line length, width and pitch of each portion of the interconnect, and to estimate the current through the terminals of the circuit elements by using circuit simulations, thereby obtaining an optimum design for the line widths of the LSI. However, such an optimum design is difficult to achieve in a practical view point because such a circuit simulation costs a large amount of processing time due to a larger number of nodes for which the currents are to be calculated.

The electro-migration of the interconnects most depends on the current density of the interconnects. For the countermeasure of the electro-migration, if the operating current is changed at timings due to the operating pattern of the LSI, it is necessary to design the line width of the interconnect so that neither of an average current component (positive-component average current) of the operating current having a positive polarity and an average current component (negative-component average current) of the operating current having a negative polarity exceeds the permissible current of the interconnect. Alternatively, there are some cases wherein the line pitch should be optimized in the design based on one of the positive-component average current and the negative-component average current depending on the structure of the contact for the interconnect.

In the conventional design method, it is impossible to calculate the positive-component average current and negative-component average current of the current flowing through each portion of the interconnect for obtaining the optimum design, while assuming the premise that the interconnect is alternately charged and discharged by the load capacitance of the entire interconnect.

In view of the above problems in the conventional technique, it is an object of the present invention to provide a method for designing the interconnects based on the nets described in the netlist for obtaining an optimum design for the interconnects.

It is also an object of the present invention to provide a program defining the method as described above.

The present invention provides a method for designing interconnects of an LSI, including the steps of: preparing a netlist including a plurality of nets each specifying connection between two of terminals of circuit elements; performing a simulation for estimating a positive-component average current and a negative-component average current of each of the terminals; defining a graph including therein a set of nodes and a set of branches each connecting two of the nodes, the set of nodes including at least some of the terminals and branch points of at least some of the branches; nominating two of the nodes connected by a target branch selected from the at least some of the branches as a positive node and a negative node based on a fixed rule, and separating the at least some of the terminals by the target branch into a positive-node terminal set and a negative-node terminal set corresponding to the positive node and the negative node; calculating a first sum of the negative-component average currents of the terminals belonging to the positive-node terminal set and a second sum of the positive-component average currents of the terminals belonging to the negative-node terminal set, to select a lower value of the first sum and the second sum as a positive-component average current of the target branch; calculating a third sum of the positive-component average currents of the terminals belonging to the positive-node terminal set and a fourth sum of the negative-component average current of the terminals belonging to the negative-node terminal set, to select a lower value of the third sum and the fourth sum as a negative-component average current of the target branch; and designing a size of an interconnect corresponding to the target branch based on the positive-component average current and the negative-component average current of the target branch.

The present invention also provides method for designing interconnects of an LSI, including the steps of: preparing a netlist including a plurality of nets each specifying connection between two of terminals of circuit elements; performing a simulation for estimating a positive-component average current and a negative-component average current of each of the terminals; separating a terminal set including a part of the terminals into a terminal sub-set and a complement of the terminal sub-set; calculating a first sum of the negative-component average currents of the terminals belonging to the terminal sub-set and a second sum of the positive-component average current of the terminals belonging to the complement of the sub-set, to select a lower value of the first sum and the second sum as an average branch current; iterating the separating and calculating for another terminal set to calculate a plurality of average branch currents; and designing a size of interconnect based on a maximum of the average branch currents.

In accordance with the method of the present invention, the average current for the interconnect corresponding to the target node can be estimated with a reasonable number of nodes for calculation and thus with a reasonable time length for the simulation.

The above and other objects, features and advantages of the present invention will be more apparent from the following description, referring to the accompanying drawings.

PREFERRED EMBODIMENTS OF THE INVENTION

Figure 1:
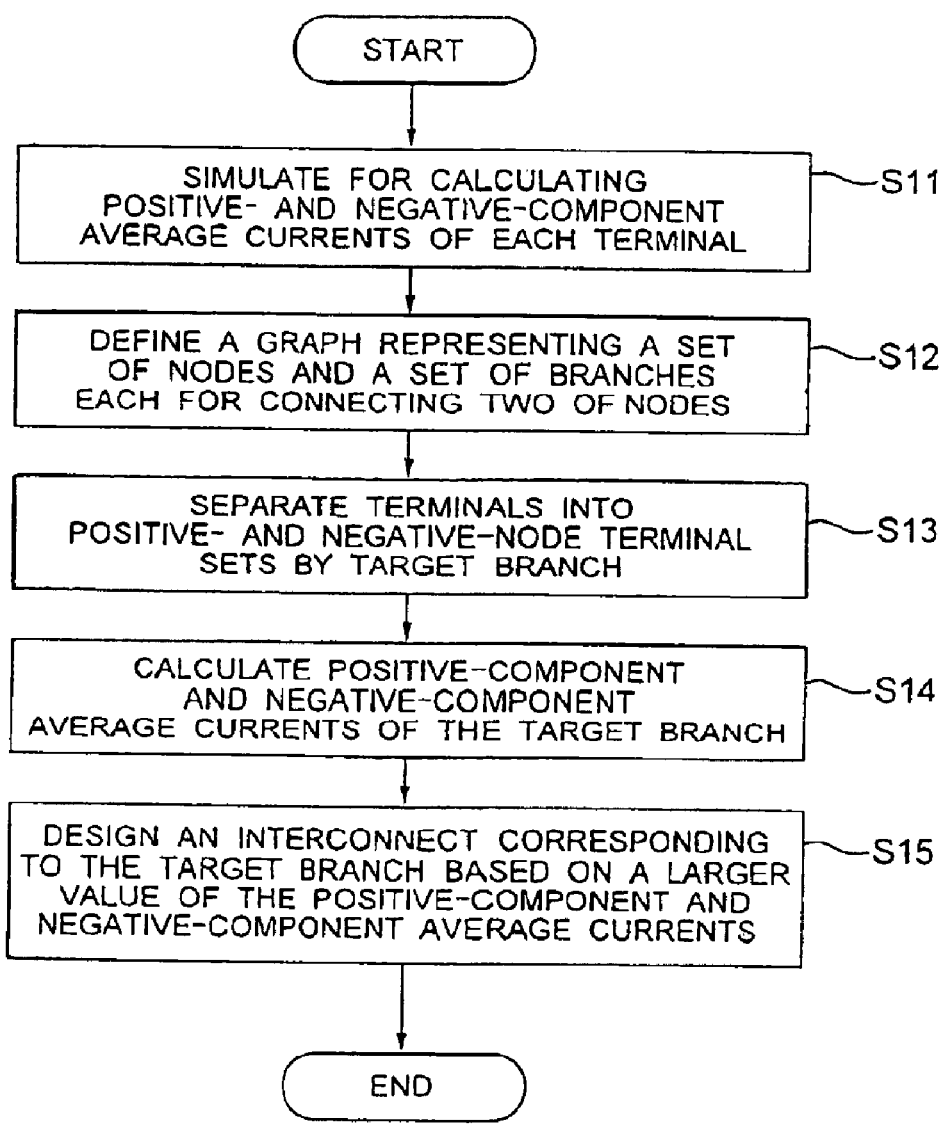
FIG. 1 is a flowchart of a method for designing interconnects according to an embodiment of the present invention.

Referring to FIG. 1, there are shown procedures of a method for designing interconnects according to an embodiment of the present invention. The procedures are executed by a computer system installed with a design program, the computer system including I/O devices, storage devices and a processor similarly to the computer system recited in the prior art.

In step 11 of FIG. 1, a circuit simulation, such as using a SPICE (trade mark) transient analysis technique, is conducted for obtaining the waveform of a terminal current I(t) flowing into/from a terminal of each of the circuit elements constituting the circuit of a LSI. The waveform of the terminal current I(t) is then used for calculating current components of the terminal current I(t), wherein the current component flowing into the terminal through a corresponding branch is defined positive and the current component flowing out of the terminal through the corresponding branch is defined negative. The time average of the positive current component, i.e., positive-component average current avg_p, of the terminal current I(t) and the time average of the negative current component, i.e., negative-component average current avg_n, of the terminal current I(t) are then calculated separately. The positive-component average current avg_p as used herein is defined by a quotient of the integral of the positive current component with respect to time by the operating time interval, whereas the negative-component average current avg_n is defined by a quotient of the integral of the negative current component with respect to time by the operating time interval. Thus, avg_p and avg_n can be expressed by:

$$\text{avg\_p} = \frac{1}{2T} \int_0^T \{|I(t)| + I(t)\} dt, \text{ and}$$

$$\text{avg\_n} = \frac{1}{2T} \int_0^T \{|I(t)| - I(t)\} dt.$$

In step 12, the nets, i.e., interconnects and nodes in the netlist are expressed by a modeled diagram, or graph, including therein a set of nodes, which include terminals of the circuit elements and branch points of the interconnects, and a set of branches each connecting two of the nodes. All the nodes are denoted in the diagram by sequential numbers.

Figure 2:
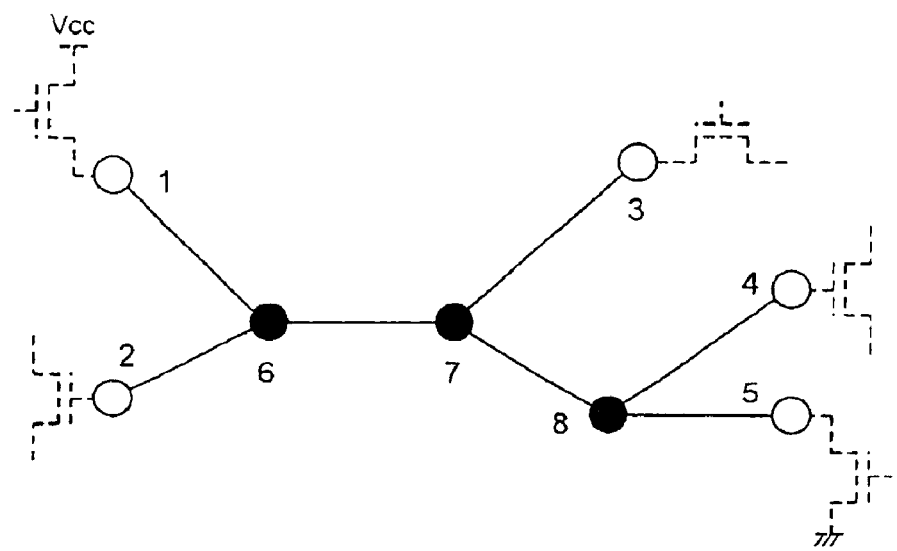
FIG. 2 is a graph representing the structure of nodes and branches obtained from netlist and obtained in the procedure of step 12 in FIG. 1.

Referring to FIG. 2, there is shown an exemplified modeled diagram obtained in step 12, wherein a blank circle indicates a terminal of a circuit element, and a solid circle indicates a branch point of an interconnect, the terminals and branch points being denoted by a set of sequential numbers. Solid lines indicate branches, whereas dotted lines indicate circuit elements such as p-ch and n-ch MOSFETs, which are connected through nodes to interconnects, such as bus lines of a data bus.

In step 13, a branch connecting together two of the nodes, such as nodes #6 and #7 in FIG. 2, is noticed as a target branch, wherein one of the nodes having a lower sequential number is referred to as a positive node and the other of the nodes having a higher sequential number is referred to as a negative node in this example. The current flowing through the target branch from the positive node toward the negative node is defined as a positive current. Then, all the terminals are separated into two groups, i.e., terminal sets with respect to the target branch. In this separation, the terminal set disposed near the positive node of the target branch is defined as a positive-node terminal set, whereas the other terminal set disposed near the negative node of the target branch is defined as a negative-node terminal set.

In step S14, a sum of the negative-component average currents of all the terminals belonging to the positive-node terminal set is calculated, and another sum of the positive-component average currents of all the terminals belonging to the negative-node terminal set is also calculated. The lower value of the above two sums is then selected and herein referred to as a positive-component average current Iavg_p of the target branch.

Similarly, a sum of the positive-component average currents of all the terminals belonging to the positive-node terminal set is calculated, and another sum of the negative-component average currents of all the terminals belonging to the negative-node terminal set is also calculated. The lower value of the above two sums is then selected and herein referred to as a negative-component average current Iavg_n of the target branch.

Thus, Iavg_p and Iavg_n of the target branch are expressed by:

$$\text{Iavg\_p} = \min\left(\sum_{m=1}^{M} a_m \cdot \text{avg\_n}_m, \sum_{m=1}^{M} (1-a_m) \cdot \text{avg\_p}_m\right)$$

$$\text{Iavg\_n} = \min\left(\sum_{m=1}^{M} a_m \cdot \text{avg\_p}_m, \sum_{m=1}^{M} (1-a_m) \cdot \text{avg\_n}_m\right)$$

wherein m is the sequential number of each of the terminals, M is the highest sequential number of the terminals, and $a_m=1$ or $a_m=0$ depending on the m-th terminal belonging to the positive-node terminal set or the negative-node terminal set.

In step 15, a larger value of the positive-component average current Iavg_p and the negative-component average current Iavg_n of the target branch is selected as the operating current of the target branch. These procedures are iterated for all the target branches in the netlist, and the width of each of the target branches is determined based on the operating current thus obtained.

Figure 3:
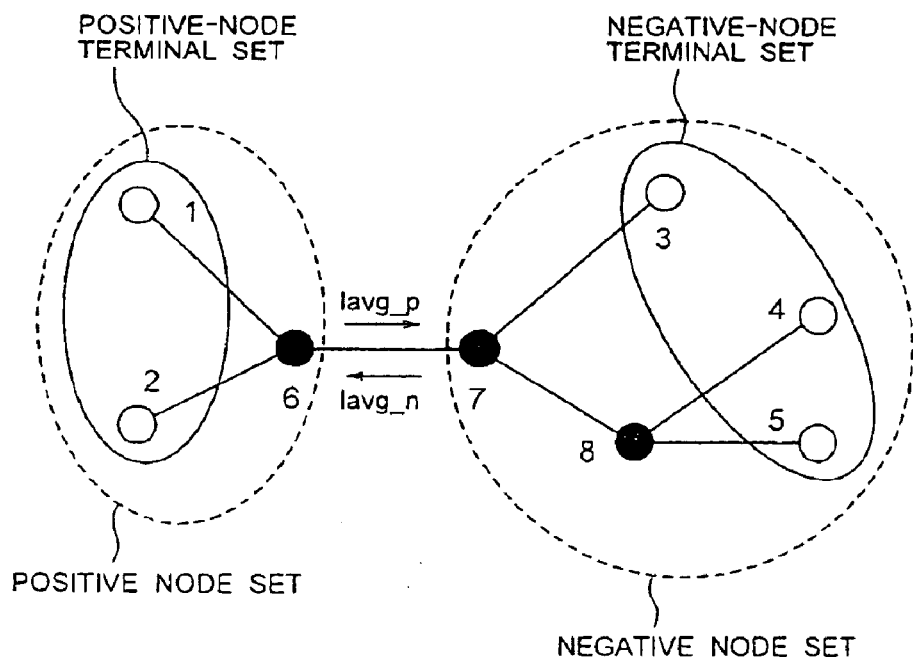
FIG. 3 shows the graph of FIG. 2, illustrating the procedures of steps 13 and 14 shown in FIG. 1.
Figure 4:
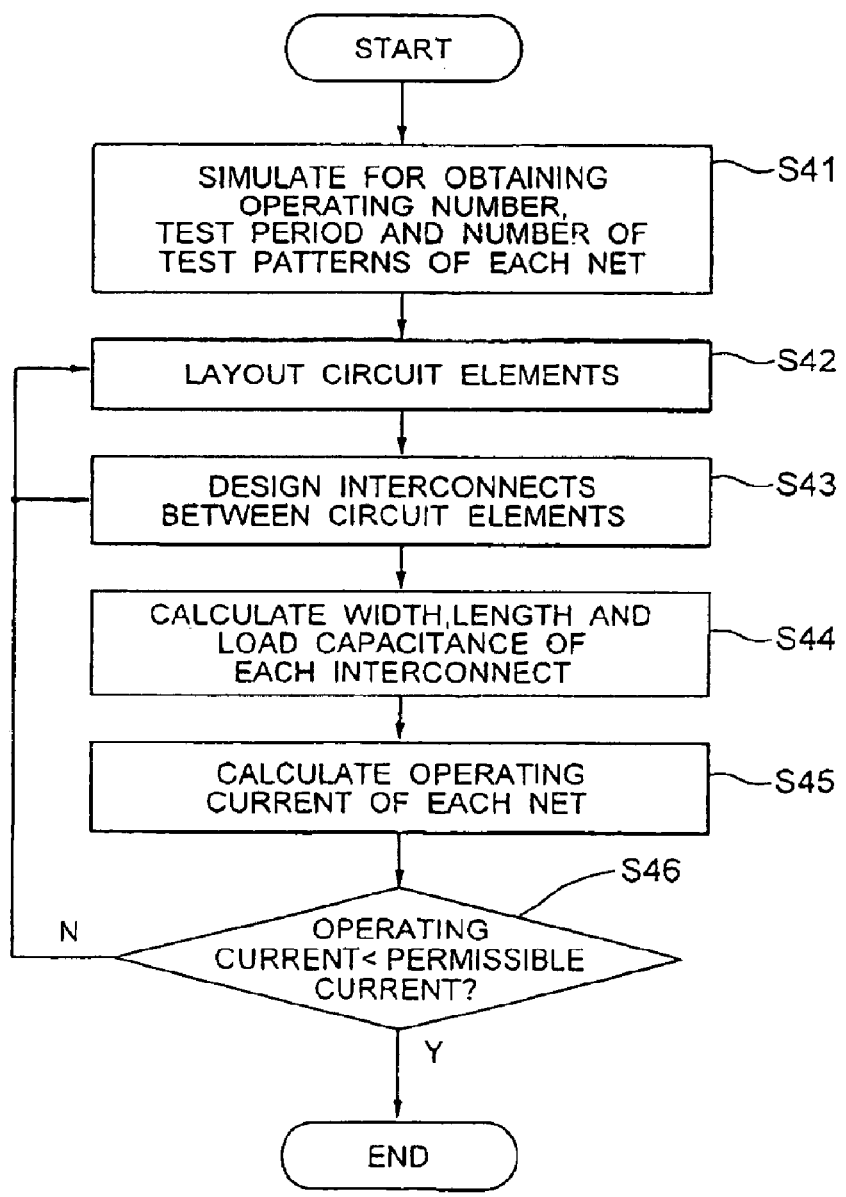
FIG. 4 is a flowchart of a conventional method for designing interconnects.

Referring to FIG. 3, there are shown practical procedures of steps 13 and 14 for processing the nodes illustrated in FIG. 2. First, a branch connecting two of the nodes #6 and #7 is noticed as a target branch, for which the operating current flowing therethrough is to be calculated. More specifically, the positive-component average current Iavg_p and the negative-component average current Iavg_n of the target branch are to be calculated.

The nodes in the structure of the graph shown in FIG. 3 are separated into two node sets: positive node set {1,2,6} and negative node set {3,4,5,7,8}. This procedure also separates the entire terminal set {1,2,3,4,5} into two terminal sets: positive-node terminal set {1,2} and negative-node terminal set {3,4,5}.

All the currents flowing into the terminals belonging to the positive-node terminal set as well as the currents flowing into the terminals belonging to the negative-node terminal set do not necessarily flow through the target branch, because some of the currents flowing into the terminals may flow out of another of the terminals within the same terminal set. However, if it is assumed that all the currents flowing into the terminals in one of the terminal sets flow out of the other of the terminal sets through the target branch, this is the worst case among the cases considered.

Thus, the sum of the negative-component average currents of the terminals belonging to the positive-node terminal set {1,2} and the sum of the positive-component average currents of the terminals belonging to the negative-node terminal set {3,4,5} are calculated as the positive-component average currents of the target branch of the positive node #6 and the negative node #7, respectively.

Similarly, the sum of the positive-component average currents of the terminals belonging to the positive-node terminal set {1,2} and the sum of the negative-component average currents of the terminals belonging to the negative-node terminal set {3,4,5} are also calculated as the negative-component average currents of the positive node #6 and the negative node #7, respectively.

In the above calculations, since the positive-component average currents of the positive node #6 and the negative node #7 of the target branch are the maximums, the positive-component average current Iavg_p of the target branch does not exceed each of these average currents of the nodes #6 and #7. Thus, the lower value of these average currents of the nodes #6 and #7 is selected as the positive-component average current Iavg_p of the target branch in the present embodiment. Similarly, since the negative-component average currents of the nodes #6 and #7 of the target branch are the maximums, the negative-component average current Iavg_n of the target branch does not exceed these average currents of the nodes #6 and #7. Thus, the lower value of these average currents of the nodes #6 and #7 is selected as the negative-component average current Iavg_n of the target branch in the present embodiment.

In the above embodiment, after determining the structure of the node sets corresponding to a net, the positive-component average current and the negative-component average current can be estimated for the net with a reasonable number of nodes in the simulation for the net. Thus, the optimum widths etc. of the interconnects for the net in the netlist can be designed with a reasonable simulation time for the net.

In the above embodiment, the interconnect corresponding to a net in the netlist is designed after separation of the nodes with respect to the branch to thereby determine the structure of the node sets. However, the structure of the node sets may be determined under the uniform conditions wherein all the interconnections for the nets are roughly designed based on the predetermined settings.

In addition, if the structure of the graph including node sets and branch sets is not yet determined, the current of the net may be predicted by applying thereto solution of a programming problem or all 1-0 programming problem. More specifically, a terminal set is separated into two sub-sets including a terminal sub-set and the complement of the terminal sub-set, both the sum of the negative-component average currents of the terminals belonging to the terminal sub-set and the sum of the positive-component average currents of the terminals belonging to the complement of the terminal sub-set are estimated, the lower value of these sums is then selected as the operating current of the target branch. This current is calculated for each of the terminal sets, and the maximum of these operating currents thus obtained is uniformly used as a design current for the interconnects.

Since the above embodiments are described only for examples, the present invention is not limited to the above embodiments and various modifications or alterations can be easily made therefrom by those skilled in the art without departing from the scope of the present invention. For example, the node having a lower sequential number may be referred to as a negative node and a higher sequential number may be referred to as a positive node. In an alternative, any fixed rule for determining the positive node and the negative node may be used.

What is claimed is:

1. A method for designing interconnects of an LSI, comprising the steps of:

preparing a netlist including a plurality of nets each specifying connection between two of terminals of circuit elements;

performing a simulation for estimating a positive-component average current and a negative-component average current of each of said terminals;

defining a graph including therein a set of nodes and a set of branches each connecting two of said nodes, said set of nodes including at least some of said terminals and branch points of at least some of said branches;

nominating two of said nodes connected by a target branch selected from said at least some of said branches as a positive node and a negative node by using a fixed rule, and separating said at least some of said terminals by said target branch into a positive-node terminal set and a negative-node terminal set corresponding to said positive node and said negative node;

calculating a first sum of said negative-component average currents of said terminals belonging to said positive-node terminal set and a second sum of said positive-component average current of said terminals belonging to said negative-node terminal set, to select a lower value of said first sum and said second sum as a positive-component average current of said target branch;

calculating a third sum of said positive-component average currents of said terminals belonging to said positive-node terminal set and a fourth sum of said negative-component average currents of said terminals belonging to said negative-node terminal set, to select a lower value of said third sum and said fourth sum as a negative-component average current of said target branch; and designing a size of an interconnect corresponding to said target branch based on said positive-component average current and said negative-component average current of said target branch.

2. The method according to claim 1, wherein said size designing step includes selecting a larger value of said positive-component average current and said negative-component average current of said target branch as a branch current of said target branch.

3. The method according to claim 1, wherein said simulation performing step includes obtaining a waveform of a current of said each of said terminals.

4. The method according to claim 1, wherein said positive-component average current avg_p and said negative-component average current avg_n of said each of said terminals are respectively represented by:

$$\text{avg\_p} = \frac{1}{2T}\int_0^T \{|I(t)| + I(t)\}dt, \text{ and}$$

$$\text{avg\_n} = \frac{1}{2T}\int_0^T \{|I(t)| - I(t)\}dt,$$

where I(t) and T are terminal current of said each of said terminals and a period of said terminal current, respectively.

5. The method according to claim 4, wherein said positive-component average current Iavg_p and said negative-component average current Iavg_n of said target branch are respectively represented by:

$$\text{Iavg\_p} = \min\left(\sum_{m=1}^M a_m \cdot \text{avg\_n}_m, \sum_{m=1}^M (1-a_m) \cdot \text{avg\_p}_m\right), \text{ and}$$

$$\text{Iavg\_n} = \min\left(\sum_{m=1}^M a_m \cdot \text{avg\_p}_m, \sum_{m=1}^M (1-a_m) \cdot \text{avg\_n}_m\right),$$

where m is said sequential number, M is the highest number of said sequential numbers, and $a_m=1$ or $a_m=0$ depending on a m-th terminal belonging to said positive-node terminal set or said negative-node terminal set.

6. A method for designing interconnects of an LSI, comprising the steps of:

preparing a netlist including a plurality of nets each specifying performing a simulation for estimating a positive-component average current and a negative-component average current of each of said terminals;

separating a terminal set including a part of said terminals into a terminal sub-set and a complement of said terminal sub-set;

calculating a first sum of said negative-component average currents of said terminals belonging to said terminal sub-set and a second sum of said positive-component average current of said terminals belonging to said complement of said sub-set, to select a lower value of said first sum and said second sum as an average branch current of a target branch;

iterating said separating and calculating for another terminal set to calculate a plurality of average branch currents; and designing a size of interconnect based on said average branch currents.

7. The method according to claim 6, wherein said simulation performing step includes obtaining a waveform of a current of said each of said terminals.

8. The method according to claim 6, wherein said positive-component average current avg_p and said negative-component average current avg_n of said each of said terminals are respectively represented by:

$$\text{avg\_p} = \frac{1}{2T}\int_0^T \{|I(t)| + I(t)\}dt, \text{ and}$$

$$\text{avg\_n} = \frac{1}{2T}\int_0^T \{|I(t)| - I(t)\}dt,$$

where I(t) and T are terminal current of said each of said terminals and a period of said terminal current, respectively.

9. A program stored on a medium for running on a computer system, said program defining the steps of:

preparing a netlist including a plurality of nets each specifying connection between two of terminals of circuit elements;

performing a simulation for estimating a positive-component average current and a negative-component average current of each of said terminals;

defining a graph including therein a set of nodes and a set of branches each connecting two of said nodes, said set of nodes including at least some of said terminals and branch points of at least some of said branches;

nominating two of said nodes connected by a target branch selected from said at least some of said branches as a positive node and a negative node based on a fixed rule, and separating said at least some of said terminals by said target branch into a positive-node terminal set and a negative-node terminal set corresponding to said positive node and said negative node;

calculating a first sum of said negative-component average currents of said terminals belonging to said positive-node terminal set and a second sum of said positive-component average currents of said terminals belonging to said negative-node terminal set, to select a lower value of said first sum and said second sum as a positive-component average current of said target branch;

calculating a third sum of said positive-component average currents of said terminals belonging to said positive-node terminal set and a fourth sum of said negative-component average currents of said terminals belonging to said negative-node terminal set, to select a lower value of said third sum and said fourth sum as a negative-component average current of said target branch; and designing a size of an interconnect corresponding to said target branch based on said positive-component average current and said negative-component average current of said target branch.

10. A program stored on a medium for running on a computer system, said program defining the steps of:

preparing a netlist including a plurality of nets each specifying connection between two of terminals of circuit elements;

performing a simulation for estimating a positive-component average current and a negative-component average current of each of said terminals;

separating a terminal set including a part of said terminals into a terminal sub-set and a complement of said terminal sub-set;

calculating a first sum of said negative-component average currents of said terminals belonging to said terminal sub-set and a second sum of said positive-component average current of said terminals belonging to said complement of said sub-set, to select a lower value of said first sum and said second sum as an average branch current;

iterating said separating and calculating for another terminal set to calculate a plurality of average branch currents; and designing a size of interconnect based on said average branch currents.

* * * * *